United States Patent
Matsumoto

(10) Patent No.: US 7,461,322 B2
(45) Date of Patent: Dec. 2, 2008

(54) COMMUNICATION SYSTEM, RECEIVER, TRANSMITTER AND COMMUNICATION METHOD

(75) Inventor: Wataru Matsumoto, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 704 days.

(21) Appl. No.: 10/482,486

(22) PCT Filed: Feb. 7, 2003

(86) PCT No.: PCT/JP03/01334

§ 371 (c)(1),
(2), (4) Date: Dec. 31, 2003

(87) PCT Pub. No.: WO03/069839

PCT Pub. Date: Aug. 21, 2003

(65) Prior Publication Data
US 2004/0185886 A1    Sep. 23, 2004

(30) Foreign Application Priority Data
Feb. 13, 2002    (JP) ............................. 2002/035390

(51) Int. Cl.
*H03M 13/00* (2006.01)
(52) U.S. Cl. ...................... 714/758; 714/795
(58) Field of Classification Search ............ 714/758, 714/794, 795, 796, 775, 789, 744, 751; 375/261
See application file for complete search history.

(56) References Cited

U.S. PATENT DOCUMENTS

| | | | |
|---|---|---|---|
| 5,930,267 A * | 7/1999 | Daneshrad et al. ........ 370/509 |
| 6,097,716 A | 8/2000 | Abrishamkar | |
| 6,381,723 B1 * | 4/2002 | Koyama ...................... 714/751 |
| 6,985,536 B2 * | 1/2006 | Oelcer et al. ................ 375/261 |
| 6,988,236 B2 * | 1/2006 | Ptasinski et al. ............ 714/758 |

FOREIGN PATENT DOCUMENTS

| | | |
|---|---|---|
| JP | 62-193336 A | 8/1987 |
| JP | 8-125640 A | 5/1996 |
| JP | 8-163108 A | 6/1996 |
| JP | 20-150439 A | 6/1998 |
| JP | 2001-168733 A | 6/2001 |
| JP | 2003-68024 A | 3/2003 |

(Continued)

OTHER PUBLICATIONS

Y. Kou et al., "Low Density Parity Check Codes Based on Finite Geometries: A Rediscovery," ISIT 2000, pp. 200, Sorrento, Italy, Jun. 25 to 30, 2000.

(Continued)

*Primary Examiner*—Mujtaba K. Chaudry
*Assistant Examiner*—Fritz Alphonse
(74) *Attorney, Agent, or Firm*—Birch, Stewart, Kolasch & Birch, LLP

(57) ABSTRACT

A communication system according to the present invention comprises a transmitter for performing low-density parity-check (LDPC) coding and a receiver for performing LDPC decoding based on the "Sum-Product algorithm", and performing a synchronous control and a user detection by using a sum of absolute values of logarithm likelihood ratio of the posterior probability of each bit that is output as a decoding result.

24 Claims, 13 Drawing Sheets

FOREIGN PATENT DOCUMENTS

JP      2003-115768 A      4/2003

OTHER PUBLICATIONS

M. Luby et al., "Improved Low Density Parity Check Codes Using Irregular Graphs and Belief Propagation," Proceedings of 1998 IEEE International Symposium on Information Theory, pp. 171, Cambridge, Mass., Aug. 16 to 21, 1998.

T. Richardson et al., "The Capacity of Low-Density Parity Check Codes Under Message-Passing Decoding," IEEE Transactions on Information Theory, vol. 47, No. 2, Feb. 2001, pp. 599-618.

S-Y. Chung, et al., "Analysis of Sum-Product Decoding of Low-Density Parity-Check Codes Using a Gaussian Approximation," IEEE Transactions on Information Theory, vol. 47, No. 2, pp. 657-670, Feb. 2001.

Yeo et al., "High Throughout Low-Density Parity-Check Decoder Architectures", Global Telecommunication conference, vol. 5 of 6, pp. 3019-3024 (Nov. 2001).

Ahmed et al., Institute Of Electrical and Electronics Engineers, "Block-size estimation and application to BTFD for 3GPP UMTS" vol. 5 of 6, pp. 3045-3049, (Nov. 2001).

Del-toso et al., "Standard compliatn VDSL: a flexible and efficient solution for EFM over Copper" Internet Article, (Jul. 2001).

Sohn et al., "Blind Rate Detection Algorithm in WCDMA Mobile Receiver" Vehicular Technology Conference, vol. 1 of 4, pp. 1589-1592 (Oct. 7, 2001).

IBM "G.gen: LDPC codes for G. dmt.bis and 1-19 G. lite.bis." Internet Article,(Jan. 2001).

* cited by examiner

PAYLOAD DATA ENCODED
WITH LDPC CODES

FIG.9 irregular LDPC CODES AT rate = 0.5

| | | | |
|---|---|---|---|
| $D_1$ | 32 | | |
| Rate | 0.5 | | |
| CODE LENGTH | 6140 | | |
| | X | $\lambda_x$ | No. |
| | 2 | 0.165506 | 2709 |
| | 3 | 0.187867 | 2050 |
| | 6 | 0.007331 | 40 |
| | 7 | 0 | 0 |
| | 8 | 0.223851 | 916 |
| | 32 | 0.4154 | 425 |
| | X | $\rho_x$ | No. |
| | 10 | 0.3125 | 1023 |
| | 11 | 0.6875 | 2046 | irregular LDPC CODES AT rate = 0.5 (USER A)

| D1 | 32 | | |
|---|---|---|---|
| Rate | 0.5 | | |
| | x | $\lambda_x$ | No. |
| | 2 | 0.165506 | 2709 |
| | 3 | 0.187867 | 2050 |
| | 6 | 0.007331 | 40 |
| | 7 | 0 | 0 |
| | 8 | 0.223851 | 916 |
| | 32 | 0.4154 | 425 |
| | x | $\rho_x$ | No. |
| | 10 | 0.3125 | 1023 |
| | 11 | 0.6875 | 2046 |

FIG.17 irregular LDPC CODES AT rate = 0.5 (USER B)

| D₁ | 32 | | |
|---|---|---|---|
| Rate | 0.5 | | |
| | x | $\lambda_x$ | No. |
| | 2 | 0.178580156 | 2923 |
| | 3 | 0.149376833 | 1630 |
| | 6 | 0.02016129 | 110 |
| | 7 | 0.219819159 | 1028 |
| | 8 | 0.005865103 | 24 |
| | 32 | 0.426197458 | 436 |
| | X | $\rho_x$ | No. |
| | 10 | 0.3125 | 1023 |
| | 11 | 0.6875 | 2046 |

COMMUNICATION SYSTEM, RECEIVER, TRANSMITTER AND COMMUNICATION METHOD

TECHNICAL FIELD

The present invention relates to a communication system, a receiver, a transmitter and a communication method, which can perform synchronous control and user detection using a check matrix corresponding to a generator matrix at the time of encoding.

BACKGROUND ART

A conventional synchronization establishing method and user detection method will be described below. The conventional synchronization establishing method will be explained first. For example, the transmission side sends N phase-inverted signals (preambles) (see the top and the middle in FIG. 19). The reception side, on the other hand, detects inversion of the phase in a preamble, outputs a sync signal at this timing (see the bottom in FIG. 19), and demodulates data of a waveform to be modulated. Normally, to ensure accurate synchronization even in a channel with a lot of noise, the number N is often set equal to or more than 10.

The conventional user detection method will be explained next. Normally, the reception side checks if a received frame is a communication frame directed to the local device by using a user code to be transmitted following the preamble (see FIG. 20). At this time, the reception side performs user detection depending on whether it matches with a unique code assigned to the local device. In general, to reduce the probability that code patterns coincide with each other by accident due to noise or the like, at least one byte (8 bits) is often allocated to the user code. As the configuration of the communication frame, for example, various control codes are located before and after the user code and data (payload data) for a user are located following them (see FIG. 20).

As the conventional communication system carries out synchronous control and user detection by arranging preambles and a user code in a communication frame, however, there is a problem that the communication frame becomes redundant.

DISCLOSURE OF THE INVENTION

It is an object of the present invention to solve at least the problems in the conventional technology.

The communication system according to one aspect of the present invention includes a transmitter that performs low-density parity-check encoding, and a receiver that low-density parity-check-decodes reception data of a code word length sampled from a predetermined sampling start point based on a "Sum-Product Algorithm" and executes a synchronous control using a sum of absolute values of logarithmic likelihood ratios of posterior probabilities of individual bits output as a result of a decoding.

The receiver according to another aspect of the present invention communicates with a transmitter that performs low-density parity-check encoding. The receiver low-density parity-check-decodes reception data of a code word length sampled from a predetermined sampling start point based on a "Sum-Product Algorithm" and executes a synchronous control using a sum of absolute values of logarithmic likelihood ratios of posterior probabilities of individual bits output as a result of a decoding.

The transmitter according to still another aspect of the present invention continuously transmitting transmission data low-density parity-check-encoded with a user-specific code.

The communication method according to still another aspect of the present invention includes low-density parity-check encoding of transmission data at a transmitter, low-density parity-check decoding of reception data of a code word length sampled from a predetermined sampling start point based on a "Sum-Product Algorithm", and executing a synchronous control using a sum of absolute values of logarithmic likelihood ratios of posterior probabilities of individual bits output as a result of a the decoding.

The other objects, features and advantages of the present invention are specifically set forth in or will become apparent from the following detailed descriptions of the invention when read in conjunction with the accompanying drawings.

BRIEF DESCRIPTION OF THE DRAWINGS

FIG. 9 is a table of an example of ensemble of "Irregular-LDPC codes";

FIG. 17 is a table of another example of diversification of a check matrix;

BEST MODE FOR CARRYING OUT THE INVENTION

Exemplary embodiments of a communication system, receiver, transmitter, and communication method according to the present invention is described in detail with reference to the accompanying drawings. However, it is to be noted that the invention is not limited by the embodiments.

Figure 1:
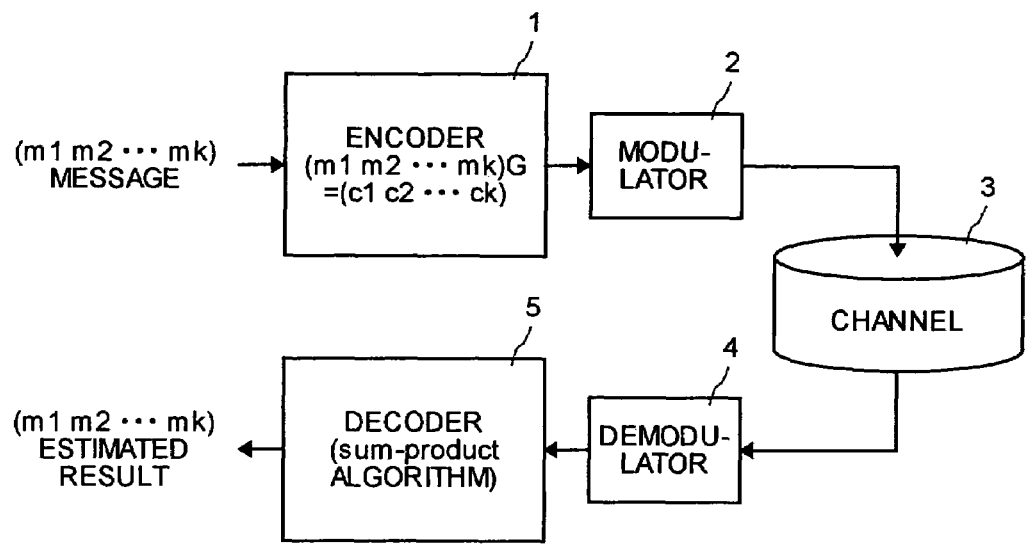
FIG. 1 is a schematic diagram of a communication system according to the present invention.

FIG. 1 is a schematic diagram of an LDPC encoding/decoding system according to the present invention. The LDPC encoding/decoding system includes an encoder 1, a modulator 2, a channel 3, a demodulator 4, and a decoder 5.

Prior to explanation of a conventional method of generating check matrixes for LDPC codes, flows of encoding and decoding using LDPC codes are explained first.

At the sending side, the encoder 1 generates a check matrix H using a certain method later described. Then, a generator matrix G is derived from the following condition.

G: k×n matrix (k: Information length, n: Code word length)

$GH^T=0$ (T denotes Transposition)

The encoder 1 then receives a message ($m_1 m_2 \ldots m_k$) of an information length k, and generates a code word C using the generator matrix G.

$$C = (m_1 m_2 \ldots m_k)G$$
$$= (c_1 c_2 \ldots c_n)(\text{where } H(c_1 c_2 \ldots c_n)^T = 0)$$

The modulator 2 subjects the generated code word C to a digital modulation such as BPSK (binary phase shift keying), QPSK (quadrature phase shift keying) and multi-valued QAM (quadrature amplitude modulation) and sends the modulated signal.

At the receiving side, on the other hand, the demodulator 4 receives the modulated signal via the channel 3, and subjects it to a digital demodulation such as BPSK, QPSK and multi-valued QAM. The decoder 5 then subjects the LDPC-coded, demodulated result to an iterative decoding by "Sum-Product Algorithm" and provides an estimated result (corresponding to the original matrix ($m_1 m_2 \ldots m_k$)).

Figure 2:
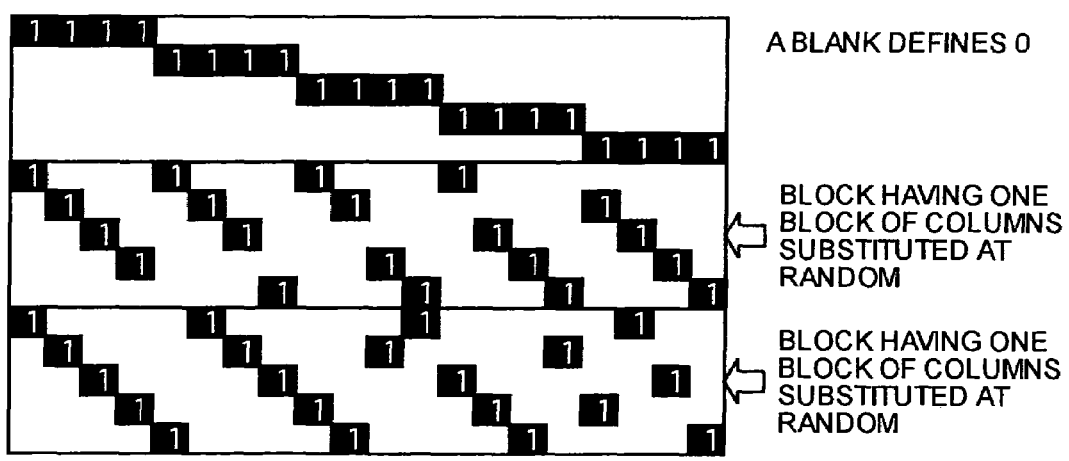
FIG. 2 is a check matrix proposed by Gallager for low-density parity-check (LDPC) codes.

As a check matrix for LDPC codes, Gallager, the proposer of LDPC, proposes the following matrix (see FIG. 2).

A matrix shown in FIG. 2 is a matrix of two values of "1" and "0" with the portions of "1" filled. The other portions are all "0". This matrix has four "1's" in one row (which is expressed as a weight of a row) and three "1's" in one column (which is expressed as a weight of a column), and is generally called "Regular-LDPC codes" because the weights of all the columns and rows are even. For the Gallager codes, for example, a matrix is separated into three blocks, with random substitution performed on the second block and the third block, as shown in FIG. 2.

One whose rows and columns do not have an even weight distribution, e.g., that which has an uneven weight distribution such as having five columns of a weight of 3 and ten columns of a weight of 5, is called "Irregular-LDPC codes". Particularly, the code configuration of "Irregular-LDPC codes" can constitute a considerably large number of patterns by changing the weight distribution.

Encoding procedures and decoding procedures in the communication system according to the present embodiment will be described using the most basic Gallager LDPC codes (see FIG. 2).

First, LDPC codes shown in FIG. 2, for example, are treated as an original matrix A in the encoder 1. The original matrix A can be expressed as equation (1).

$$A=[c_1|c_2] \quad (1)$$

Figure 3:
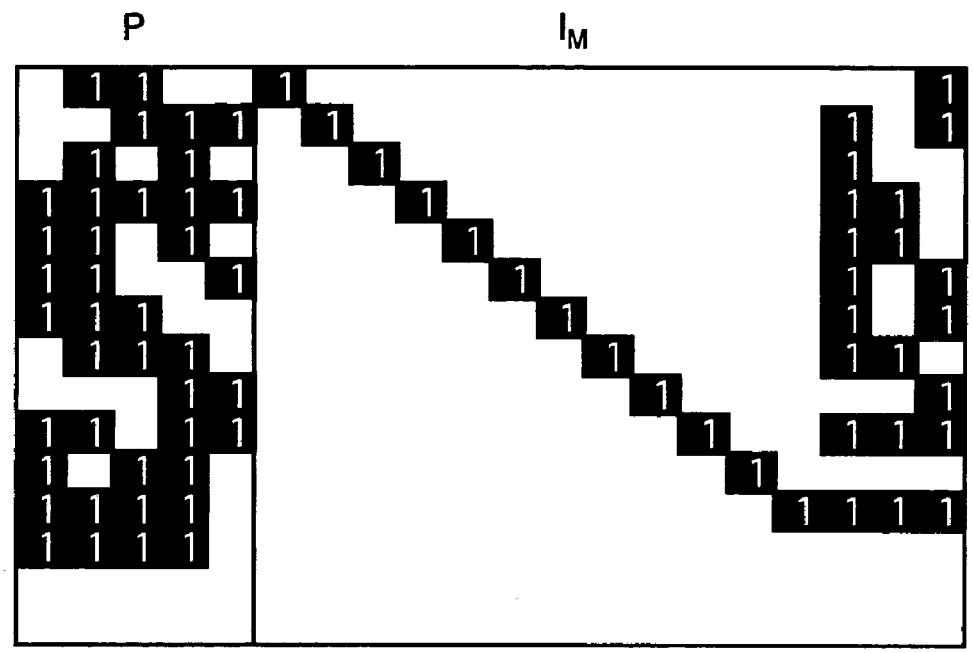
FIG. 3 is a result of executing "Gaussian Elimination" on the LDPC codes shown in FIG. 2 as an original matrix.

Next, the encoder 1 executes "Gaussian Elimination" on the original matrix A to generate a parity check matrix H as given in equation (2).

$$H=[c_2^{-1}c_1|c_2^{-1}c_2]=[P|I_M] \quad (2)$$

where $P=c_2^{-1} c_1$ and $I_M=c_2^{-1} c_2$ (unit matrix). FIG. 3 is a diagram of results of executing "Gaussian Elimination".

Figure 4:
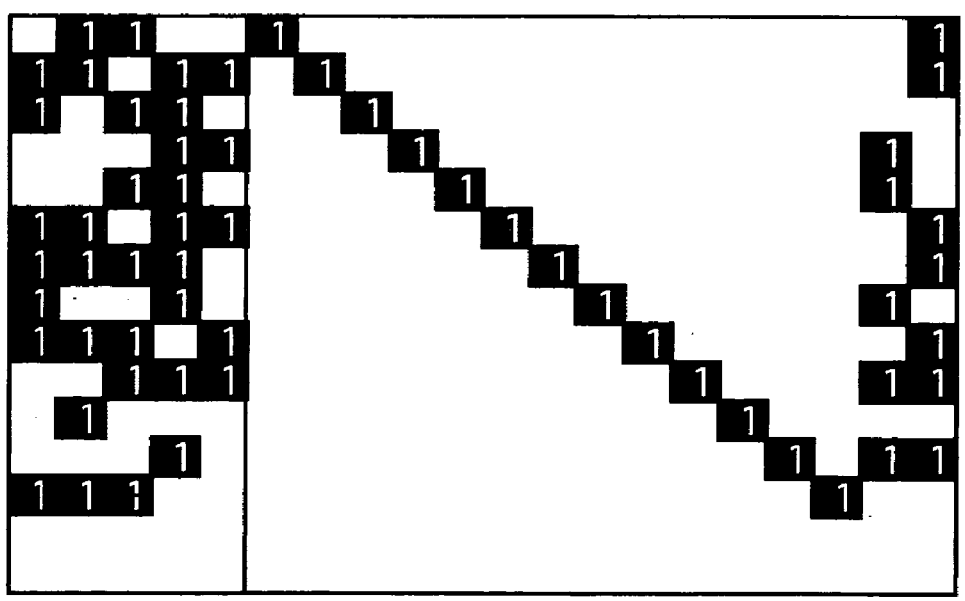
FIG. 4 is a result of executing "Gaussian Elimination" on the matrix shown in FIG. 3.

As the bottom three rows are not a unit matrix (see FIG. 3), the encoder 1 executes "Gaussian Elimination" column by column and further executes "Gaussian Elimination" on incomplete portions row by row. FIG. 4 is a diagram of results of executing "Gaussian Elimination". Here, two columns are an all 0 matrix.

Figure 5:
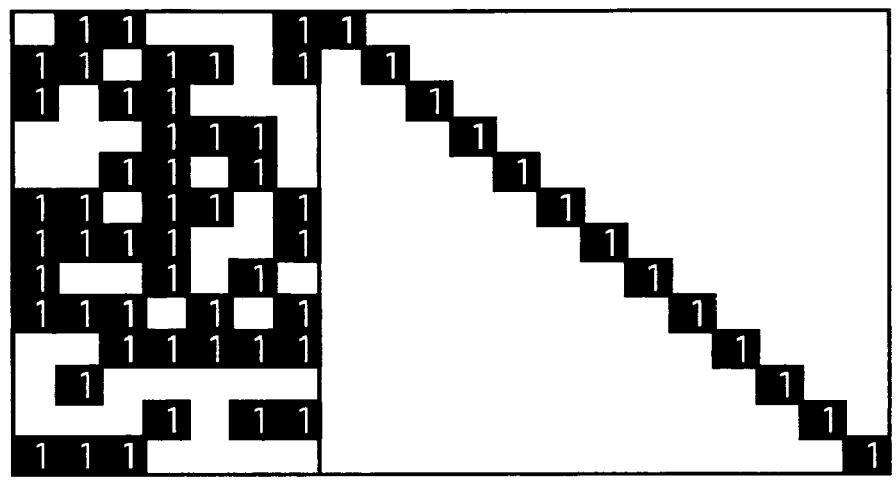
FIG. 5 is a final parity check matrix H generated by an encoder.

Next, as the right two columns are not a unit matrix (see FIG. 4), the encoder 1 inserts those two columns in the sixth column and seventh column from the left. Then, the bottom two rows are eliminated. Accordingly, a final parity check matrix H becomes a matrix of N×K=20×13. FIG. 5 is the final parity check matrix H generated by the encoder 1.

Finally, the encoder 1 acquires a generator matrix G (see equation (3)) using the parity check matrix H shown in FIG. 5, then generates a transmission series Z (length N) (see equation (4)).

$$G^T = \begin{bmatrix} I_K \\ P \end{bmatrix} = \begin{bmatrix} I_K \\ C_2^{-1}C_1 \end{bmatrix} \quad (3)$$

$$Z=Gs\bmod 2 \quad (4)$$

where s represents an information series (length K).

Meanwhile, the decoder 5 on the reception side uses, for example, an ordinary "Sum-Product Algorithm" as a decoding method of LDPC.

First, the decoder 5 acquires the likelihood of the transmission series Z(=Gsmod2). Let $f_t^{x(t)}(x(t): 0, 1)$ be the likelihood of transmission data x(t) in a received signal y(t) at time t. The likelihood $f_t^{x(t)}$ means P(y(t)|x(t)=1) and represents the probability of receiving the received signal y(t) when x(t)=1.

Specifically, for example, given that at is the logarithmic likelihood ratio of the likelihood $f_t^{x(t)=1}$ with respect to the likelihood $f_t^{x(t)=0}$, the logarithmic likelihood ratio $\alpha_t$ can be expressed as given by equation (5).

$$\alpha_t' = \ln\frac{f_t^{x(t)=0}}{f_t^{x(t)=1}} = \ln\frac{1-f_t^{x(t)=1}}{f_t^{x(t)=1}} = \quad (5)$$

$$\ln\frac{\frac{1}{\sqrt{2\pi\sigma^2}}\exp\left\{-\frac{1}{2\sigma^2}(y(t)+a)^2\right\}}{\frac{1}{\sqrt{2\pi\sigma^2}}\exp\left\{-\frac{1}{2\sigma^2}(y(t)-a)^2\right\}} = -\frac{4ay(t)}{2\sigma^2} = -\frac{2ay(t)}{\sigma^2}$$

Figure 6:
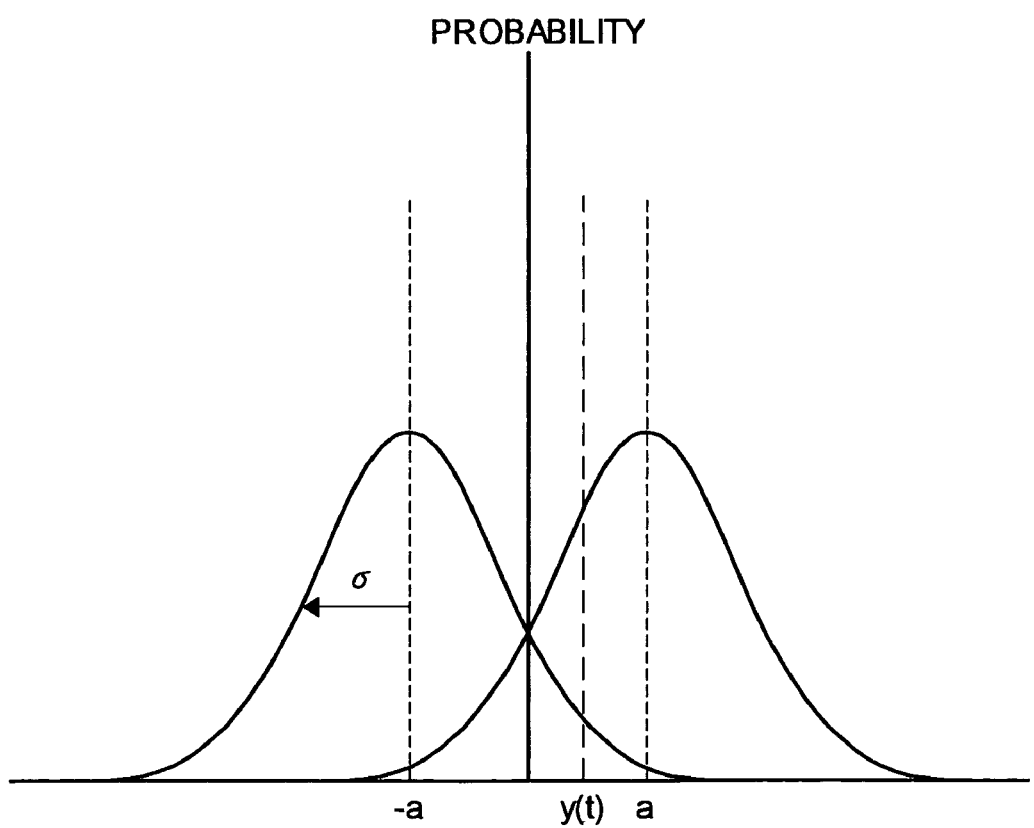
FIG. 6 is a graph of a probability density distribution at a reception point.

Note that $\sigma^2$ represents the dispersion value of noise ($\sigma$ being the standard deviation of noise). FIG. 6 is a graph of a probability density distribution at a reception point. The vertical axis in FIG. 6 represents the probability and the horizontal axis represents the position of the received signal y(t).

Then, the equation (5) is transformed to a logarithmic likelihood ratio exp$\alpha_t$, as shown in equation (6).

$$\exp\alpha_t = \frac{1 - f_t^{x(t)=1}}{f_t^{x(t)=1}} \quad (6)$$

Therefore, the likelihood $f_t^{x(t)}$ can be expressed as given by equation (7) and equation (8).

$$f_t^{x(t)=1} = \frac{1}{1+\exp\alpha_1} = \frac{1}{1+\exp\left(-\frac{2ay(t)}{\hat{\sigma}^2}\right)} \quad (7)$$

$$f_t^{x(t)=0} = 1 - f_t^{x(t)=1} \quad (8)$$

Next, the decoder 5 decodes the transmission series by performing the following processes.

(1) As the initial setting, a probability $q_{mn}^x$ at which the n-th bit in a bit series X is x(0 or 1) is made to the following equation (9) and equation (10) (Initialization). Note that m represents a check row and n represents a bit column. Further, the time t is (t=n) corresponding to a bit column n.

$$q_{mn}^0 = f_t^0 \quad (9)$$

$$q_{mn}^1 = f_t^1 \quad (10)$$

(2) $q_{mn}^0 - q_{mn}^1 = \delta(q_{mh})$ and computations in equation (11), equation (12) and equation (13) are performed on individual m and n (Horizontal Step).

$$\delta r_{mn} = \prod_{h \in N(m)\backslash n} \delta q_{mh} \quad (11)$$

$$r_{mn}^0 = (1 + \delta r_{mn})/2 \quad (12)$$

$$r_{mn}^1 = (1 - \delta r_{mn})/2 \quad (13)$$

where $N(m)(\equiv\{n:H_{mn}=1\})$ represents a set of the bit columns n which participate in a check row $N(m)\backslash n$ represents a set $N(m)$ excluding the bit columns n, and $r_{mn}^x$ represents the probability of the check row m which has an isolated distribution in which bits h other than n are given by a probability $q_{mh}$.

(3) Case of each m, n and x=0, 1, the value of $q_{mn}^x$ is updated by the following equation (14) (Vertical Step).

$$q_{mn}^x = \alpha_{mn} f_t^x \prod_{i \in M(n)\backslash m} r_{in}^x \quad (14)$$

Let a logarithmic likelihood ratio $\alpha_{mn}$ be $\alpha_{mn} = 1/(q_{mn}^0 + q_{mn}^1)$. $M(n)(\equiv\{m:H_{mn}=1\})$ represents a set of the check rows m which are to be checked by the participant bit columns n, and i represents a check row other than m. And, pseudo posterior probabilities $q_n^0$, $q_n^1$ are updated by the following equation (15).

$$q_n^x = \alpha_t f_t^x \prod_{m \notin M(n)} r_{mn}^x \quad (15)$$

Then, the decoder 5 repeatedly executes the process until HX'=0 where X' represents a series of x(0 or 1) with a higher probability.

While the foregoing description has been given of the ordinary encoding/decoding method, the following explains a case of the encoding/decoding method is adapted to a communication method (synchronous control) according to the present embodiment.

Figure 7:
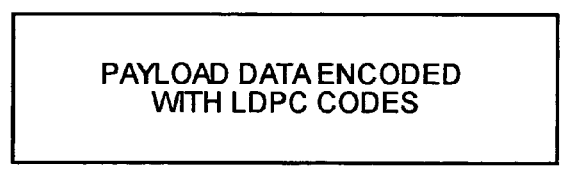
FIG. 7 is a schematic diagram of a communication frame according to the first embodiment of the present invention.

FIG. 7 is a schematic diagram of a communication frame according to the first embodiment. As shown in FIG. 7, the transmission side sends only LDPC-coded data.

Figure 8:
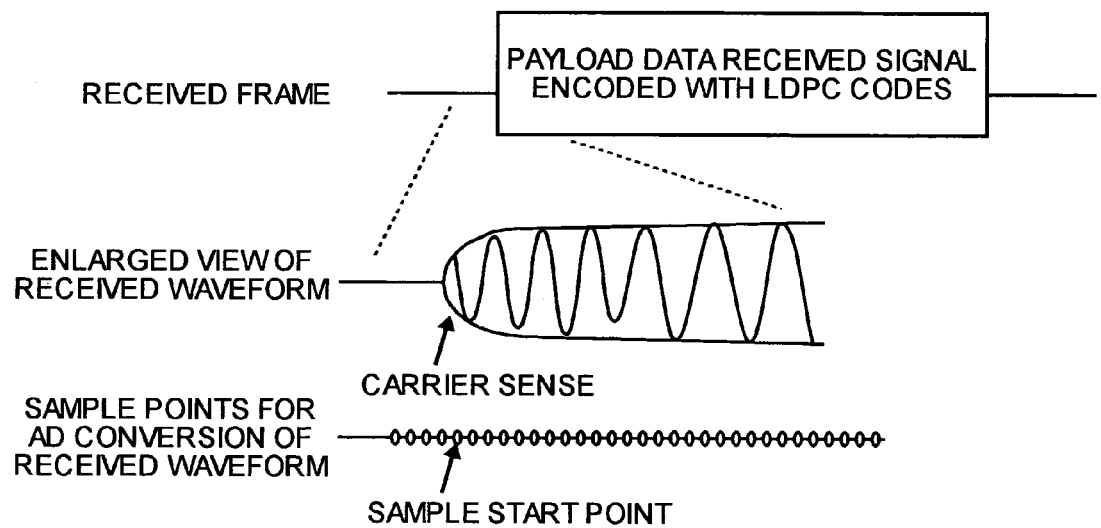
FIG. 8 is a schematic diagram of a reception sample point according to the first embodiment.

FIG. 8 is a schematic diagram of a reception sample point according to the first embodiment. As shown in FIG. 8, the reception side carrier-senses a point with an increased signal energy. Therefore, the decoder 5 starts sampling at this carrier sense point or several samples before the carrier sense point in consideration that the actual top has not been caught due to the sensibility of the carrier sense, and performs LDPC decoding by the code length using the "Sum-Product Algorithm". This can efficiently limit the number of sampling start points.

Specifically, given that the pseudo posterior probabilities which are output in single decoding are expressed by a logarithmic likelihood ratio $\upsilon_n$, they can be expressed by equation (16). The sum of the absolute values of the logarithmic likelihood ratios $\upsilon_n$, Sum_abs_LLRs, is given by equation (17).

$$\upsilon_n = \ln\frac{q_n^0}{q_n^1} \quad (16)$$

$$\text{Sum\_abs\_LLRs} = \sum_{n=1}^{N} |\upsilon_n| = \sum_{n=1}^{N} \left|\ln\frac{q_n^0}{q_n^1}\right| \quad (17)$$

Using the sum Sum_abs_LLRs of the absolute values of the logarithmic likelihood ratios $\upsilon n$ represented by the above equation (17), therefore, the decoder 5 detects the sampling start point at which that value becomes maximum and sets this point as a synchronous position. This can ensure accurate extraction of the synchronous position. When a clear sampling start point is not found in single decoding, the iterative number is increased and decoding is repeated until the difference in the sum Sum_abs_LLRs of the absolute values of the logarithmic likelihood ratios $\upsilon_n$ becomes clear.

The following illustrates one example of the synchronous control.

FIG. 9 is a table of an example of ensemble (weight distribution) of "Irregular-LDPC codes". $D_1$ represents the maximum value of the weight of a column, $\lambda_x$ represents the ratio of all the weights included in a column with the weight x with respect to the weights of the entire check matrix, $\rho_x$ represents the ratio of all the weights included in a row with the weight x with respect to the weights of the entire check matrix, and No. represents the number of the columns or rows with weight of a column. When the total number of weights for the check matrix is 32736, for example, the number of columns with x=32 is No.=425 and the ratio becomes $\lambda_x=32\times425/32736=0.4154$. Here, it was verified whether synchronization has been acquired by using the "Irregular-LDPC codes" with the encoding efficiency (Rate)=0.5.

Figure 10:
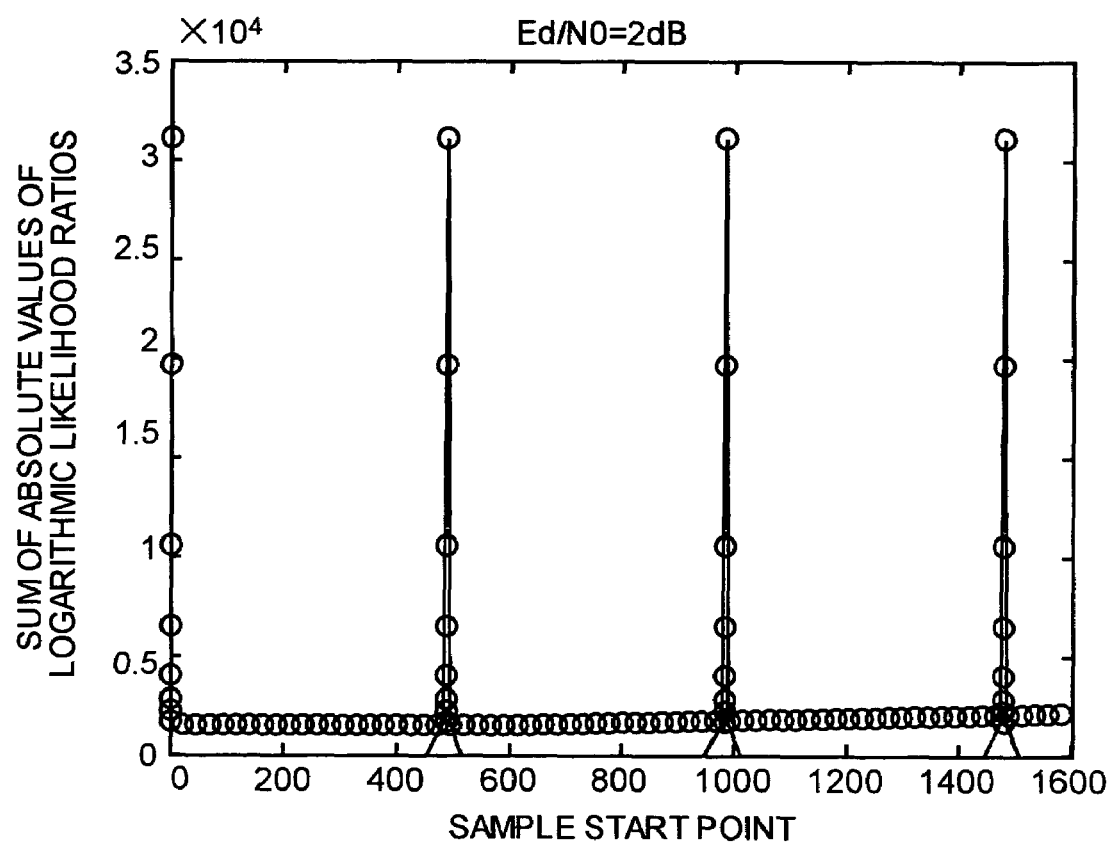
FIG. 10 is a graph illustrating an example of a relation between a sampling start point and a sum of absolute values of logarithmic likelihood ratios.

FIG. 10 is a graph illustrating a relation between the sampling start point and the sum of the absolute values of logarithmic likelihood ratios when simulation is carried out using LDPC codes in FIG. 9 at a signal-to-noise ratio (Eb/N0)=2.0 decibels per one information bit under additive white Gaussian Noise (AWGN). Here, it is assumed that four code words have been transmitted with the 0-th sample to the 511th sample taken as a single code word, the 512th sample to the 1023rd sample taken as a single code word, and the 1024th sample to the 1535th sample taken as a single code word, and the 1536th sample to the 2047th sample as a single code number. The sum of the absolute values of the logarithmic likelihood ratios becomes the largest when the 0-th sample, the 512th sample, the 1024th sample and the 1536th sample taken as sampling start points. That is, it is understood that the synchronous position is accurately extracted even for the very low signal to noise ratio (SNR) of Eb/N0=2.0 decibels.

Figure 11:
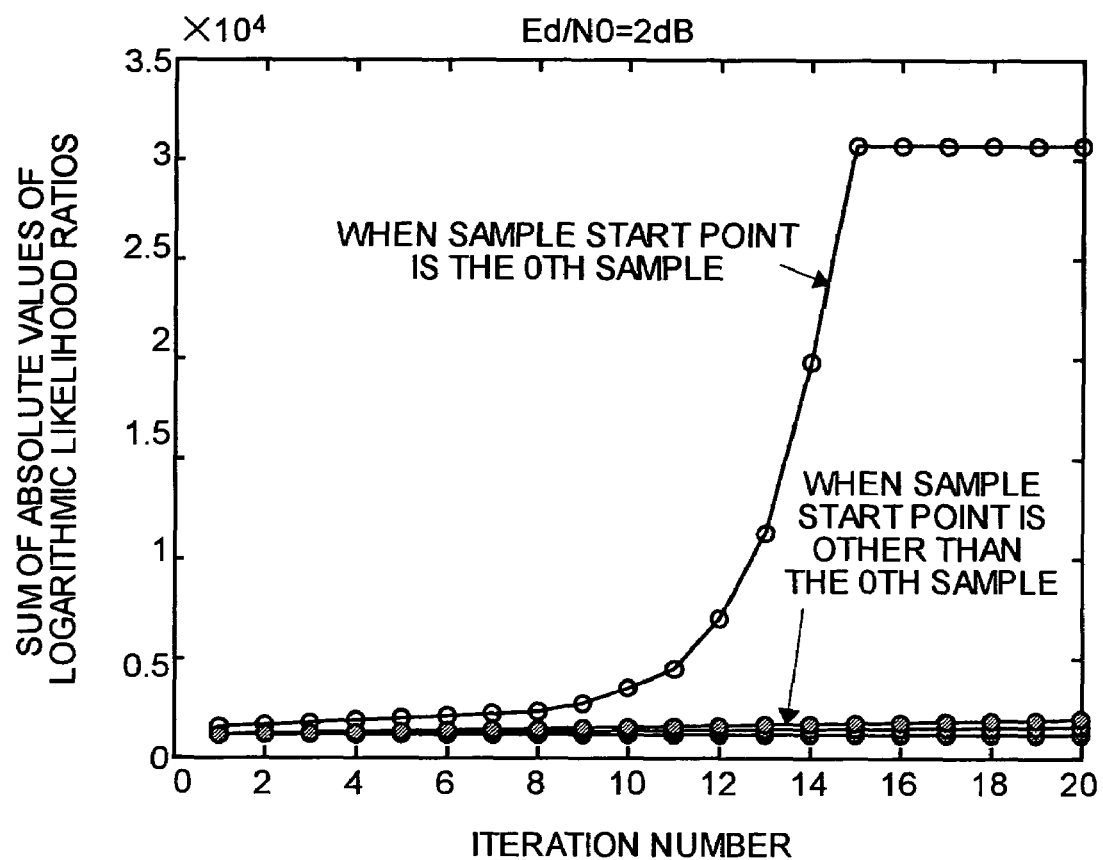
FIG. 11 is a graph illustrating an example of a relation between number of iterative decoding and the sum of the absolute values of logarithmic likelihood ratios.

FIG. 11 is a graph illustrating a relation between an iterative decoding number at a plurality of sampling start points from the 0-th sample to the 511-th sample and the sum of the absolute values of logarithmic likelihood ratios under the same condition. In this example, even if the iterative decoding number is increased at a sampling start point other than the 0-th sample, the sum of the absolute values of the logarithmic likelihood ratios is not increased. With the 0-th sample taken as a sampling start point, on the other hand, the sum starts increasing from the second iterative decoding and rapidly increases from the tenth one or above. Even for the very low SNR of Eb/N0=2.0 decibels, therefore, the sampling start point can be detected clearly through several iterative decodings. As apparent from FIG. 10 and FIG. 11, therefore, this sampling start point becomes a point of a symbol synchronization.

After the point of a symbol synchronization is established, the decoder 5 executes iterative decoding at that position and continues iterative decoding until the result HX' decided hard from the logarithmic likelihood ratios becomes HX'=0.

Next, sampling synchronization and clock synchronization are established based on the hard decision result.

Figure 12:
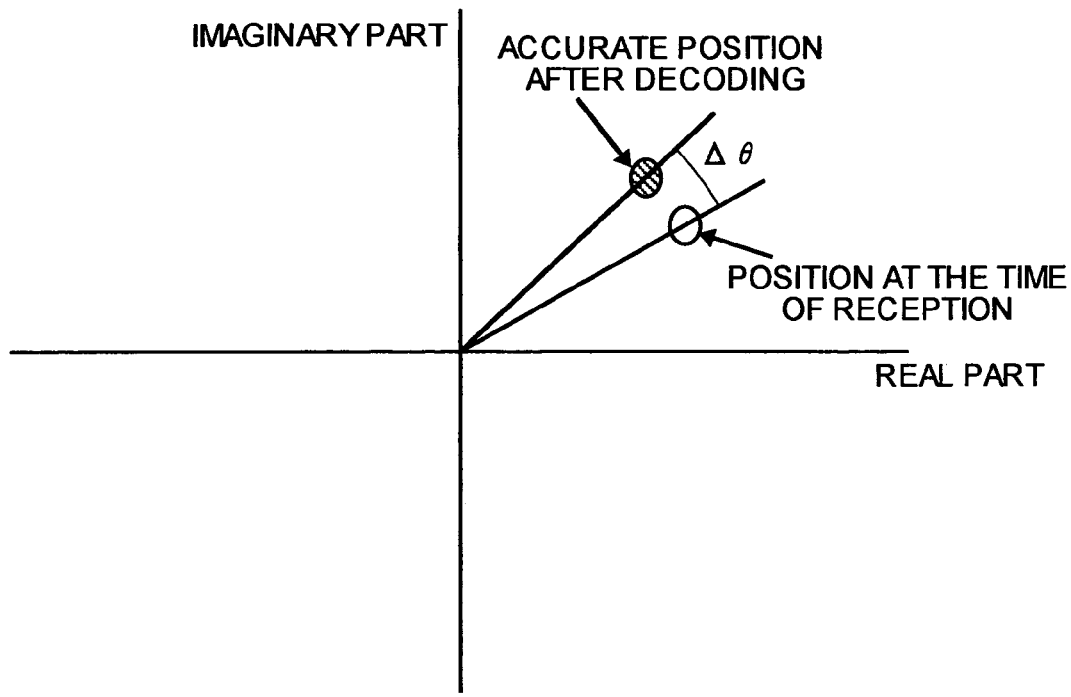
FIG. 12 is a graph of an accurate data point after decoding and a data point at the time of reception in a complex coordinate.

FIG. 12 is a graph of an accurate constellation point after decoding and a constellation point at the time of reception. Here, a phase difference between data (position) settled after decoding and received data (position) is compared. Further, $\Delta\theta$ is assigned to be a phase difference between the accurate constellation point after decoding and the constellation point at the time of reception.

Figure 13:
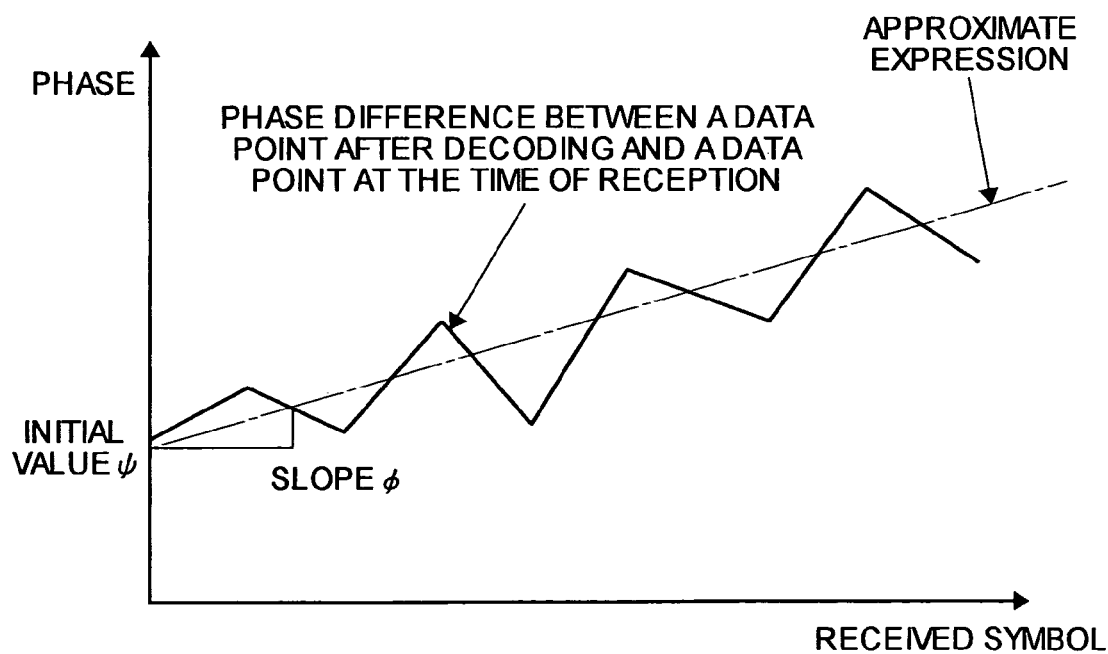
FIG. 13 is a graph of a phase difference $\Delta\theta$ for each symbol of received waveform.

FIG. 13 is a graph of a phase difference $\Delta\theta$ for each symbol of the received waveform. Here, the phase difference $\Delta\theta$ for each received symbol is approximated by a linear equation given by equation (18).

$$\Delta\theta = \Phi \times z + \phi \quad (18)$$

Note that z represents the position of a received symbol, $\Phi$ represents the slope, and $\phi$ represents the initial value. The initial value $\phi$ indicates an offset value of the phase difference or the deviation of a sample position. The slope $\Phi$ indicates the deviation of a reference clock for reception with respect to a reference clock for transmission. According to the present embodiment, therefore, the deviation of the sample position is corrected to establish sampling synchronization using those values and further the deviation of the reference clock is corrected to establish clock synchronization.

Figure 14:
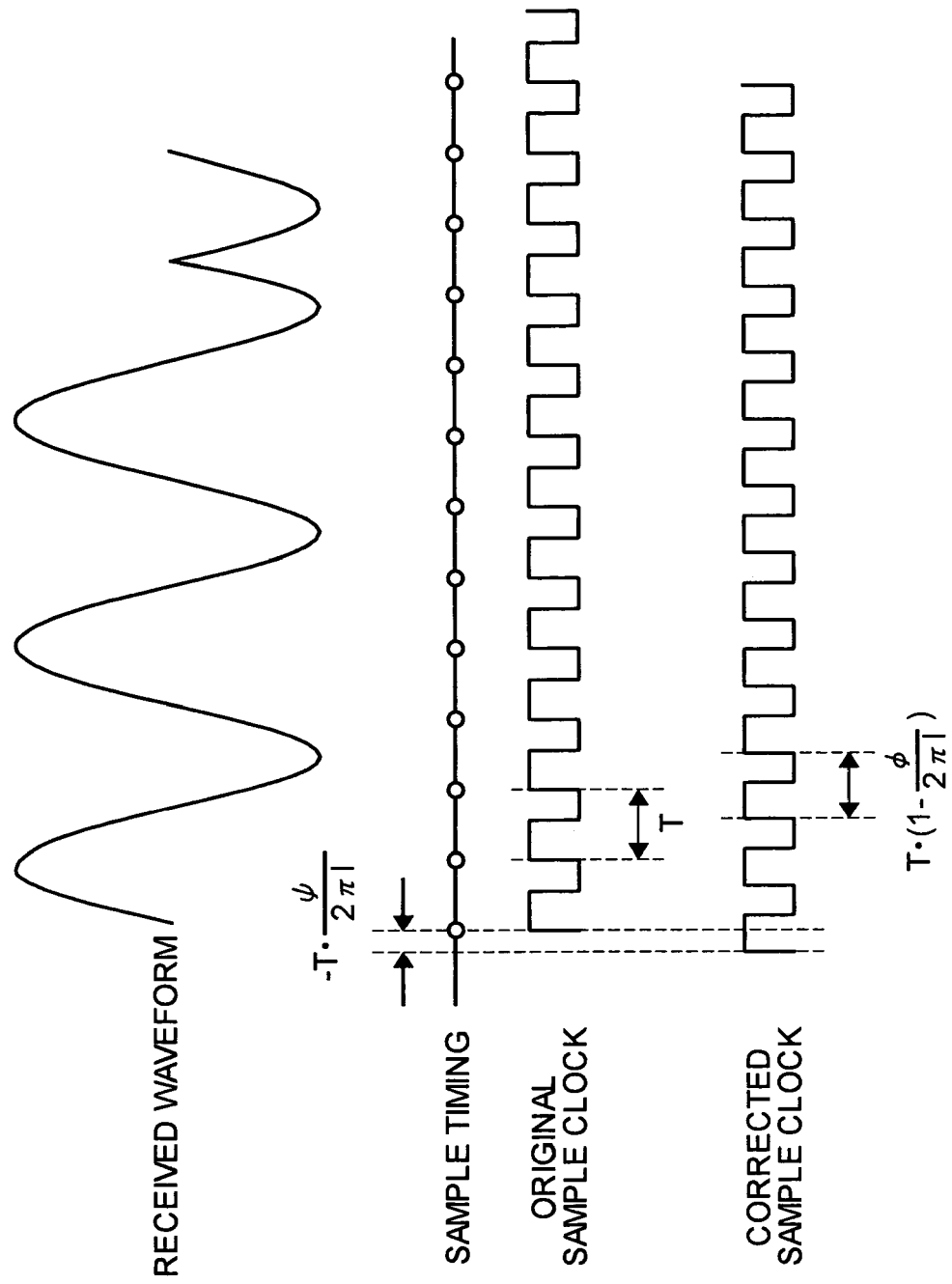
FIG. 14 is a diagram of a specific example of sample synchronous control and clock synchronous control.

FIG. 14 is a diagram of specific examples of sample synchronous control and clock synchronous control. In the diagram, T represents the period of the sample clock, and I represents the number of samples in a single symbol. As shown in FIG. 14, the sample synchronous control makes adjustment by shifting the sample timing by $T \times (\phi/2\pi I)$. The clock synchronous control makes adjustment by shifting the period of the sample clock by $T \times (1-\Phi/2\pi I)$.

Therefore, the present embodiment has taken the system configuration such that the transmitter performs LDPC encoding, and the receiver LDPC-decodes reception data of a code word length portion sampled from a predetermined sampling start point using a "Sum-Product Algorithm" and executes synchronous control using the sum of absolute values of logarithmic likelihood ratios of posterior probabilities of individual bits output as decoded results. This can ensure accurate synchronous control without using preambles and a user code.

The receiver of the present embodiment checks the sum of the absolute values of the logarithmic likelihood ratios at a plurality of sampling start points and sets that sampling start point at which the sum of the absolute values of the logarithmic likelihood ratios becomes maximum as a point of a symbol synchronization. This makes it possible to detect a sampling start point clearly.

The receiver of the present embodiment performs iterative decoding and sets a sampling start point at which the sum of the absolute values of the logarithmic likelihood ratios increases greatly as a point of a symbol synchronization. This makes it possible to detect a sampling start point clearly even when the SNR is very low.

The receiver of the present embodiment decides a sampling start point by a carrier sense. This can efficiently limit the number of sampling start points.

After setting the symbol synchronization, the receiver of the present embodiment detects a phase difference between a received signal and a decoded signal based on the decoded results, approximates the phase difference for each received symbol by the equation (18), corrects the deviation of a sample position based on the initial value of the equation (18), and corrects the deviation of a reference clock based on the slope of the equation (18). This can accurately establish sampling synchronization and clock synchronization.

Figures 15, 16:
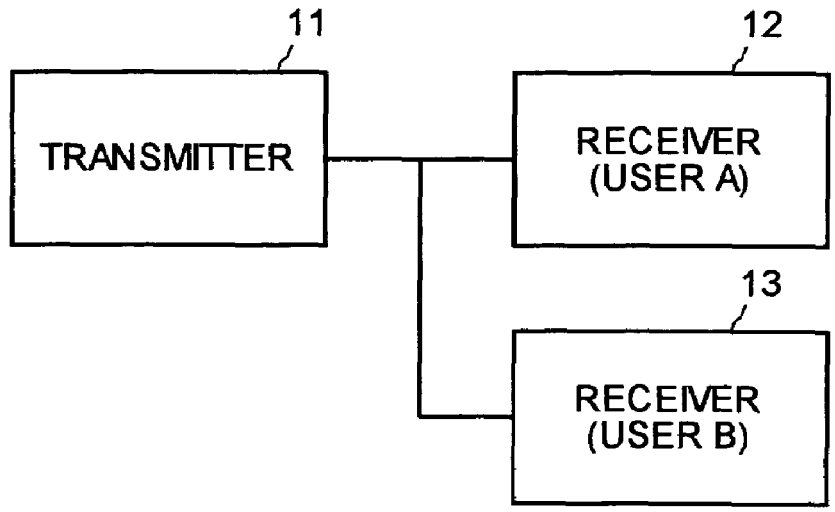
FIG. 15 is a schematic diagram of a system according to the second embodiment of the present invention.
FIG. 16 is a table of an example of diversification of a check matrix.

FIG. 15 is a schematic diagram of the system according to the second embodiment of the present invention. The system includes a transmitter 11 and receivers 12 and 13. In this embodiment, LDPC codes are provided with diversity and a user is detected by assigning each code to each user.

Because the reception side cannot perform decoding unless the generator matrix G of LDPC codes on the transmission side corresponds one to one to the check matrix H on the associated reception side, as explained in the above-described synchronous control, the check matrix is diversified by changing the ensemble exemplified in FIG. 9 to those in FIG. 16 and FIG. 17.

Figure 18A:
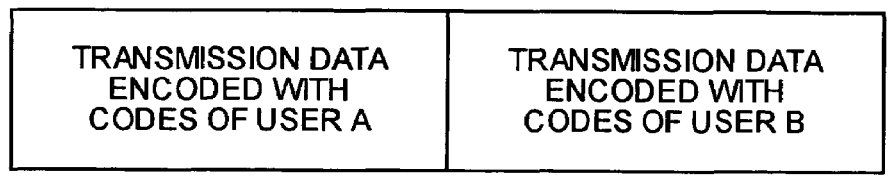
FIG. 18A and FIG. 18B depict a user detection method according to the second embodiment.
Figure 18B:
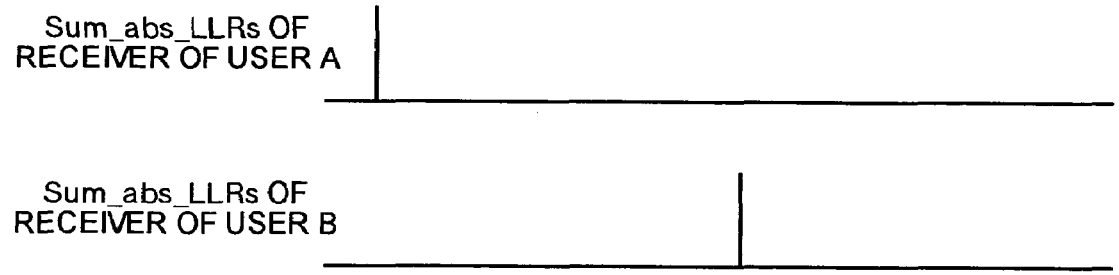
Figure 19:
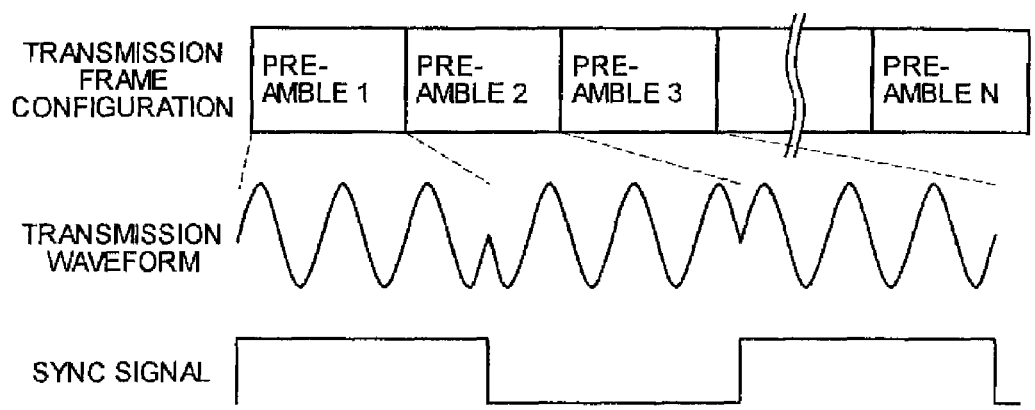
FIG. 19 is a schematic diagram of a conventional synchronous control method.
Figure 20:
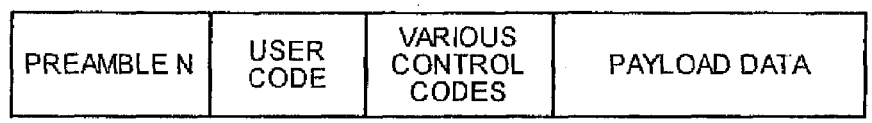
FIG. 20 is a table for explaining a conventional user detection method.

Specifically, a weight distribution shown in FIG. 16 is performed for a user A and a weight distribution shown in FIG. 17 is performed for a user B. In the system that has the transmitter:receiver to be 1:2 as shown in FIG. 15, when the transmission side has continuously transmitted transmission data encoded with the codes of the user A and transmission data encoded with the codes of the user B as shown in FIG. 18(a), for example, each of the receivers of the user A and the user B determines whether the data is directed to the local device using the sum Sum_abs_LLRs of the absolute values of the logarithmic likelihood ratios indicated by the equation (17).

As mentioned above, the present embodiment is configured in such a way that the transmission side continuously transmits transmission data encoded with user-specific codes and each of the reception sides determines whether the data is directed to the local device using the sum Sum_abs_LLRs of the absolute values of the logarithmic likelihood ratios given by the equation (17). This can allow the receiver to detect its own data without the transmitter sending a unique known user code for each user.

The functions explained in the first and second embodiments can be realized similarly by using the sum of the absolute values of the logarithmic likelihood ratios output from the decoder even when turbo codes or repeat accumulate codes are used instead of LDPC codes. In case of using turbo codes or repeat accumulate codes, however, it is possible to provide the interleaver with diversity, so that multi-user detection equal to the above-described one is realized by assigning the individual patterns of interleaving to the users individually.

As described above, according to one aspect of the present invention, it is possible to obtain a communication system that can perform accurate synchronous control without using preambles and a user code.

According to another aspect of the present invention, it is possible to obtain a communication system that can detect a sampling start point clearly.

According to still another aspect of the present invention, it is possible to obtain a communication system that can detect a sampling start point clearly even when the SNR is very low.

According to still another aspect of the present invention, it is possible to obtain a communication system that can efficiently limit the number of sampling start points.

According to still another aspect of the present invention, it is possible to obtain a communication system that can accurately establish sampling synchronization and clock synchronization.

According to still another aspect of the present invention, it is possible to obtain a communication system that can allow the receiver to detect its own data without the transmitter sending a unique known user code for each user.

According to still another aspect of the present invention, it is possible to obtain a receiver that can perform accurate synchronous control without using preambles and a user code.

According to still another aspect of the present invention, it is possible to obtain a receiver that can detect a sampling start point clearly.

According to still another aspect of the present invention, it is possible to obtain a receiver that can detect a sampling start point clearly even when the SNR is very low.

According to still another aspect of the present invention, it is possible to obtain a receiver that can efficiently limit the number of sampling start points.

According to still another aspect of the present invention, it is possible to obtain a receiver that can accurately establish sampling synchronization and clock synchronization.

According to still another aspect of the present invention, it is possible to obtain a receiver that can allow the receiver to detect its own data without the transmitter sending a unique known user code for each user.

According to still another aspect of the present invention, it is possible to obtain a transmitter that does not send a unique known user code for each user.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

INDUSTRIAL APPLICABILITY

The communication system according to the invention is effective in communication that performs synchronous control and user detection without using specific symbols such as preambles and a user code, and more particularly, suitable for a communication apparatus that performs synchronous control and user detection using a check matrix corresponding to a generator matrix at the time of encoding.

The invention claimed is:

1. A communication system comprising:
   a transmitter that performs low-density parity-check encoding; and
   a receiver that decodes low-density parity-check reception data of a code word length sampled from a predetermined sampling start point based on a "Sum-Product Algorithm" and executes a synchronous control to estimate said predetermined sampling point as a point of a symbol synchronization using a sum of absolute values of logarithmic likelihood ratios of posterior probabilities of individual bits output as a result of a decoding, detects a sampling start point at which the sum of absolute values of logarithmic likelihood ratios becomes maximum, and sets the sampling start point as a point of a symbol synchronization.

2. The communication system according to claim 1, wherein the receiver checks the sum of the absolute values of the logarithmic likelihood ratios at a plurality of sampling start points and sets the sampling start point at which the sum of the absolute values of the logarithmic likelihood ratios is a maximum as a point of a symbol synchronization.

3. The communication system according to claim 2, wherein after setting the symbol synchronization, the receiver detects a phase difference between a received signal and a decoded signal based on a result of decoding, approximates the phase difference for each received symbol with a predetermined relational equation, establishes a sampling synchronization based on an initial value of the relational equation, and establishes clock synchronization based on a slope of the relational equation.

4. The communication system according to claim 1, wherein the receiver performs iterative decoding, and sets a sampling start point at which the sum of the absolute values of the logarithmic likelihood ratios is subjected to a maximum increase as a point of a symbol synchronization.

5. The communication system according to claim 4, wherein after setting the symbol synchronization, the receiver detects a phase difference between a received signal and a decoded signal based on a result of decoding, approximates the phase difference for each received symbol with a predetermined relational equation, establishes a sampling synchronization based on an initial value of the relational equation, and establishes clock synchronization based on a slope of the relational equation.

6. The communication system according to claim 1, wherein the receiver determines the sampling start point by a carrier sense.

7. The communication system according to claim 6, wherein after setting the symbol synchronization, the receiver detects a phase difference between a received signal and a decoded signal based on a result of decoding, approximates the phase difference for each received symbol with a predetermined relational equation, establishes a sampling synchronization based on an initial value of the relational equation, and establishes clock synchronization based on a slope of the relational equation.

8. The communication system according to claim 1, wherein
the transmitter continuously transmits transmission data encoded with a user-specific code, and
the receiver determines whether the reception data is for the receiver itself based on the sum of the absolute values of the logarithmic likelihood ratios.

9. A receiver that communicates with a transmitter that performs low-density parity-check encoding, wherein the receiver decodes low-density parity-check reception data of a code word length sampled from a predetermined sampling start point based on a "Sum-Product Algorithm" and executes a synchronous control to estimate said predetermined sampling point as a point of a symbol synchronization using a sum of absolute values of logarithmic likelihood ratios of posterior probabilities of individual bits output as a result of a decoding, detects a sampling start point at which the sum of absolute values of logarithmic likelihood ratios becomes maximum, and sets the sampling start point as a point of a symbol synchronization.

10. The receiver according to claim 9, wherein the receiver checks the sum of the absolute values of the logarithmic likelihood ratios at a plurality of sampling start points and sets the sampling start point at which the sum of the absolute values of the logarithmic likelihood ratios is a maximum as a point of a symbol synchronization.

11. The receiver according to claim 10, wherein after setting the symbol synchronization, the receiver detects a phase difference between a received signal and a decoded signal based on a result of decoding, approximates the phase difference for each received symbol with a predetermined relational equation, establishes a sampling synchronization based on an initial value of the relational equation, and establishes clock synchronization based on a slope of the relational equation.

12. The receiver according to claim 9, wherein the receiver performs iterative decoding, and sets a sampling start point at which the sum of the absolute values of the logarithmic likelihood ratios is subjected to a maximum increase as a point of a symbol synchronization.

13. The receiver according to claim 12, wherein after setting the symbol synchronization, the receiver detects a phase difference between a received signal and a decoded signal based on a result of decoding, approximates the phase difference for each received symbol with a predetermined relational equation, establishes a sampling synchronization based on an initial value of the relational equation, and establishes clock synchronization based on a slope of the relational equation.

14. The receiver according to claim 9, wherein the receiver determines the sampling start point by a carrier sense.

15. The receiver according to claim 14, wherein after setting the symbol synchronization, the receiver detects a phase difference between a received signal and a decoded signal based on a result of decoding, approximates the phase difference for each received symbol with a predetermined relational equation, establishes a sampling synchronization based on an initial value of the relational equation, and establishes clock synchronization based on a slope of the relational equation.

16. The receiver according to claim 9, wherein when the transmitter continuously transmits transmission data encoded with a user-specific code, the receiver determines whether the reception data is for the receiver itself based on the sum of the absolute values of the logarithmic likelihood ratios.

17. A communication method comprising:
low-density parity-check encoding of transmission data at a transmitter;
low-density parity-check decoding of reception data of a code word length sampled from a predetermined sampling start point based on a "Sum-Product Algorithm";
executing a synchronous control to estimate said predetermined sampling point as a point of a symbol synchronization using a sum of absolute values of logarithmic likelihood ratios of posterior probabilities of individual bits output as a result of a the decoding;
detecting a sampling start point at which the sum of absolute values of logarithmic likelihood ratios becomes maximum; and
setting the sampling start point as a point of a symbol synchronization.

18. The communication method according to claim 17, wherein the low-density parity-check decoding and the executing includes
checking the sum of the absolute values of the logarithmic likelihood ratios at a plurality of sampling start points; and
setting the sampling start point at which the sum of the absolute values of the logarithmic likelihood ratios is a maximum as a point of a symbol synchronization.

19. The communication method according to claim 18, wherein the low-density parity-check decoding and the executing includes
detecting a phase difference between a received signal and a decoded signal based on a result of decoding,
approximating the phase difference for each received symbol with a predetermined relational equation,
establishing a sampling synchronization based on an initial value of the relational equation, and
establishing clock synchronization based on a slope of the relational equation.

20. The communication method according to claim 17, wherein the low-density parity-check decoding and the executing includes
performing iterative decoding, and
setting a sampling start point at which the sum of the absolute values of the logarithmic likelihood ratios is subjected to a maximum increase as a point of a symbol synchronization.

21. The communication method according to claim 20, wherein the low-density parity-check decoding and the executing includes
detecting a phase difference between a received signal and a decoded signal based on a result of decoding,
approximating the phase difference for each received symbol with a predetermined relational equation,
establishing a sampling synchronization based on an initial value of the relational equation, and
establishing clock synchronization based on a slope of the relational equation.

22. The communication method according to claim 17, wherein the low-density parity-check decoding and the executing includes determining the sampling start point by a carrier sense.

23. The communication method according to claim 22, wherein the low-density parity-check decoding and the executing includes
detecting a phase difference between a received signal and a decoded signal based on a result of decoding, approximating the phase difference for each received symbol with a predetermined relational equation, establishing a sampling synchronization based on an initial value of the relational equation, and establishing clock synchronization based on a slope of the relational equation.

24. The communication method according to claim 17, wherein the low-density parity-check encoding includes transmitting transmission data encoded with a user-specific code back to back, and the low-density parity-check decoding and the executing includes determining whether the reception data is for the receiver itself based on the sum of the absolute values of the logarithmic likelihood ratios.

* * * * *